(12) United States Patent
Hua et al.

(10) Patent No.: US 9,287,175 B2
(45) Date of Patent: Mar. 15, 2016

(54) FABRICATION METHOD FOR DICING OF SEMICONDUCTOR WAFERS USING LASER CUTTING TECHNIQUES

(71) Applicant: WIN Semiconductors Corp., Tao Yuan Shien (TW)

(72) Inventors: Chang-Huang Hua, Tao Yuan Shien (TW); Ping Wei Chen, Tao Yuan Shien (TW); Kevin Huang, Tao Yuan Shien (TW); Benny Ho, Tao Yuan Shien (TW); Chen-Che Chin, Tao Yuan Shien (TW)

(73) Assignee: WIN SEMICONDUCTORS CORP., Tao Yuan Shien (TW)

( * ) Notice: Subject to any disclaimer, the term of this patent is extended or adjusted under 35 U.S.C. 154(b) by 0 days.

(21) Appl. No.: 14/147,138

(22) Filed: Jan. 3, 2014

(65) Prior Publication Data
US 2014/0120699 A1    May 1, 2014

Related U.S. Application Data

(63) Continuation-in-part of application No. 13/079,306, filed on Apr. 4, 2011, now abandoned.

(30) Foreign Application Priority Data

Nov. 5, 2010  (TW) ................................ 99138242 A

(51) Int. Cl.
*H01L 21/82*    (2006.01)
*H01L 21/78*    (2006.01)
*H01L 21/02*    (2006.01)

(52) U.S. Cl.
CPC .......... *H01L 21/78* (2013.01); *H01L 21/02076* (2013.01)

(58) Field of Classification Search
None
See application file for complete search history.

(56) References Cited

U.S. PATENT DOCUMENTS

| | | | |
|---|---|---|---|
| 7,435,663 B2 | 10/2008 | Tseng et al. | |
| 2002/0127824 A1 | 9/2002 | Shelton et al. | |
| 2002/0182882 A1* | 12/2002 | Schuegraf et al. | ............ 438/736 |
| 2005/0136558 A1 | 6/2005 | Wang et al. | |
| 2007/0001178 A1 | 1/2007 | Tran et al. | |
| 2008/0055695 A1 | 3/2008 | DeLuca | |
| 2008/0194051 A1 | 8/2008 | Chu et al. | |

* cited by examiner

*Primary Examiner* — Alexander Ghyka
(74) *Attorney, Agent, or Firm* — Muncy, Geissler, Olds & Lowe, P.C.

(57) ABSTRACT

A fabrication method for dicing semiconductor wafers using laser cutting techniques, which can effectively prevent the devices on semiconductor die units from the phenomenon of etching undercut caused by the sequential steps after laser cutting, comprises following steps: covering the wafer surface with a protection layer; dicing the wafer by laser and separating the die units from each other; removing the laser cutting residues on the devices on the die units via wet etching by an acidic water solution; removing the protection layer by a non-acidic water solution and cleaning the devices on the die units. The selection of materials for the protection layer must consider the following factors: where (1) the materials for the protection layer must have relatively good properties for adhering and covering on the wafer; (2) the materials for the protection layer must be corrosion-resistant to the acidic water solution for etching residues.

2 Claims, 5 Drawing Sheets

FABRICATION METHOD FOR DICING OF SEMICONDUCTOR WAFERS USING LASER CUTTING TECHNIQUES

CROSS-REFERENCE TO RELATED DOCUMENTS

The present invention is a continuation in part (CIP) to a U.S. patent application Ser. No. 13/079,306 entitled "A Fabrication Method for Dicing of Semiconductor Wafers using Laser Cutting Techniques" and filed on Apr. 4, 2011.

FIELD OF THE INVENTION

The present invention relates to a fabrication method for dicing semiconductor wafers using laser cutting techniques, in particular to a fabrication method which can effectively prevent the devices on semiconductor die units from the phenomenon of etching undercut caused by the sequential steps after laser cutting.

BACKGROUND OF THE INVENTION

The semiconductor wafer should be cut into separate device chips or dies, which is an indispensable step for manufacturing semiconductor device or integrated circuit, and is one of last fabrication steps. In the past, a large size wafer was mechanically cut into separate dies using diamond knife (blade). However, mechanical cutting is very time-consuming and is apt to disrupt the wafer with very small (thin) thickness. Recently, the mechanical cutting has gradually been replaced by laser cutting for cutting the relatively brittle wafer such as gallium arsenide of III-v group. The semiconductor surface is irradiated by a focused laser light with high power and is decomposed due to the increase of local temperature. The advantages for laser cutting include rapid cutting (only one fifth of time for mechanical cutting) and that the relatively brittle semiconductor wafer being not easily disrupted.

For the gallium arsenide wafer being cut, the main problem in laser cutting is the recast of gallium arsenide residue and the microcracks at the cutting interface. FIG. 1 is a schematic view showing the cross section around the laser cutting groove. During the irradiation process of focused laser light with high power, the arsenic vapor and small particles of gallium arsenide residues would be produced due to the increase of local temperature and decomposition of gallium arsenide. The gallium arsenide residues would recast at cutting edge and on device surface. For avoiding the effect of gallium arsenide residues on the device property, the device surface must be covered with a protection layer and the gallium arsenide residues should be removed by etching method after laser cutting. The selection of materials for protection layer must consider whether the materials can resist the high temperature produced by focused laser light, and whether the materials must have good capability for adhering and covering on wafer surface. At present, the protection layer is usually made by water soluble PVA. However, the water soluble protection layer would be in the same time dissolved during the etching of the gallium arsenide residues. Therefore, the gallium arsenide around the device would also be etched in the process of the etching of gallium arsenide residues and produce the phenomenon of etching undercut at device edge, which would affect seriously the yield and reliability of devices after laser cutting.

A way to resolve the problem stated above is to use a water insoluble material as the protection layer. However, the selection of materials for protection layer must further consider other factors. For example, a tape, such as blue tape or UV tape, is generally used to fix the wafer during the process of laser cutting. Therefore, in addition to the corrosion resistance to the etching solution for gallium arsenide residues, the factor concerning the tape must be further considered. Because a general tape is easily deteriorated at a temperature higher than 80° C., a process performing at a relatively low temperature must be used to cover and remove the protection layer. Furthermore, the tape could also be deteriorated in some acidic and basic solutions, so that any solutions used in fabrication process must ensure the property of tape not being destroyed.

In view of the problems stated above, a suitable fabrication method must be developed to prevent the gallium arsenide wafer from the phenomenon of etching undercut at device edge during the etching process for removing the gallium arsenide residues after laser cutting. This is now an important issue about a fabrication method for dicing of gallium arsenide semiconductor wafer by using laser cutting techniques.

SUMMARY OF THE INVENTION

The main object of the present invention is to provide a fabrication method used for dicing semiconductor wafers by laser and for the sequential fabrication steps, which can prevent the semiconductor devices after laser cutting from the phenomenon of etching undercut created in the sequential fabrication steps, and can increase largely the yield and reliability of the devices accordingly.

To achieve the main object stated above, the present invention discloses a fabrication method, which comprises following steps:

Covering the surface of semiconductor wafers with a protection layer;

Dicing the semiconductor wafer by laser and separating the die units;

Removing the laser cutting residues on the devices on the die units via wet etching by an acidic water solution; and Removing the protection layer by a non-acidic water solution; and cleaning the devices on the die units.

In the fabrication method of the present invention, the wafer is fixed by tape during implementing. Therefore, the selection of materials for making the protection layer should further consider the following factors, where 1. The materials for the protection layer must have relatively good capability for adhering to and covering on the gallium arsenide wafer;

2. The materials for the protection layer must be corrosion-resistant to the acidic solution for etching the gallium arsenide residues;

3. The tape must not be disrupted during the steps for covering and removing the protection layer.

The materials for making protection layer, which match up to the factors stated above, include:

1. Non-metallic protection layer: polyvinyl alcohol, organic resist film, or wax.

2. Metallic protection layer: metal or alloy thin film (such as Ti or TiW), multilayer thin film (such as TiW/TiWN or Ti/TiN), or multilayer thin film of metal and oxide.

To further understand the present invention, there are several preferred embodiments for describing in detail the construction and function of the present invention by reference to the drawings.

BRIEF DESCRIPTION OF DRAWINGS

FIG. 3A is for soluble PVA protection layer in conventional process, and FIG. 3B is for photoresist protection layer according to the present invention.

FIG. 4A is for water soluble PVA protection layer in conventional process, and FIG. 4B is for photoresist protection layer according to the present invention.

DETAILED DESCRIPTIONS OF PREFERRED EMBODIMENTS

Figure 1:
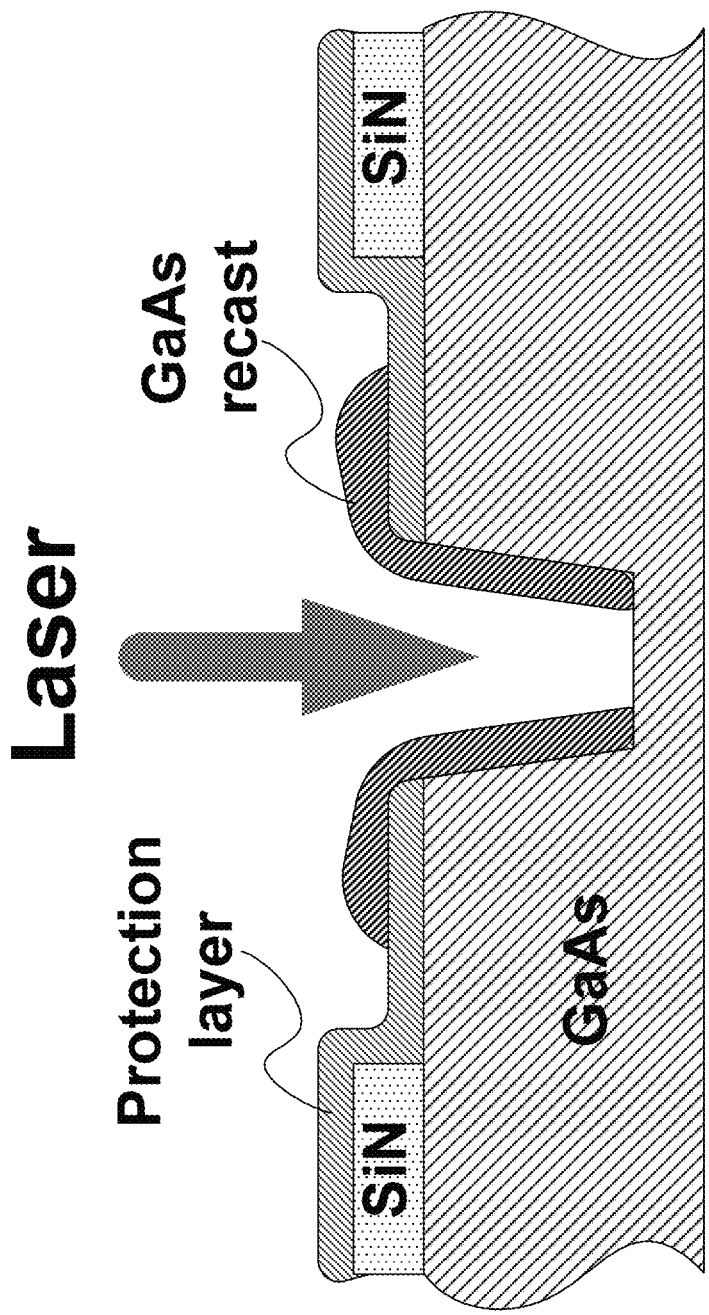
FIG. 1 is a schematic view showing the cross section of semiconductor wafer around the groove of laser cutting.
Figure 2:
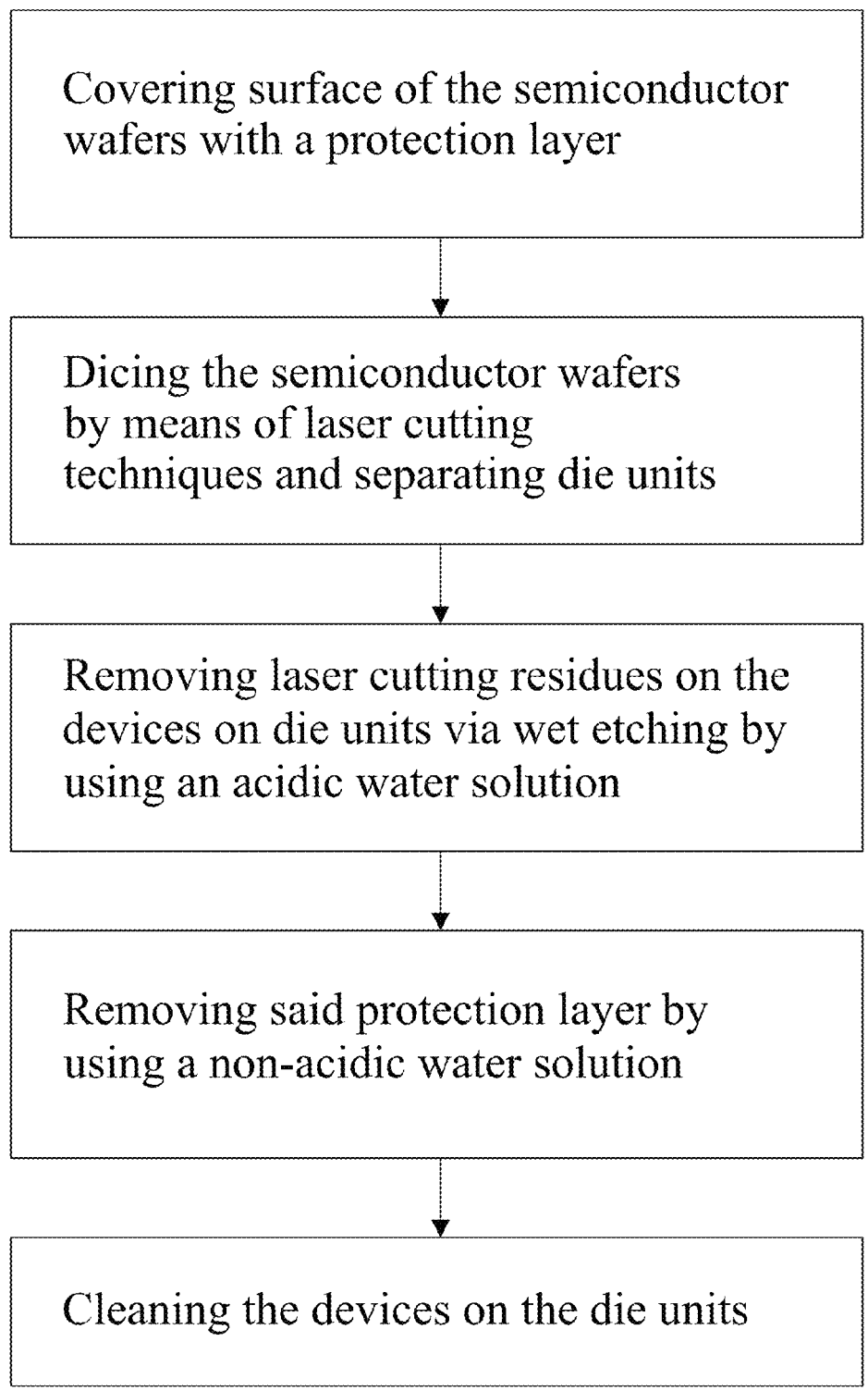
FIG. 2 is a flow chart showing the fabrication method for dicing semiconductor wafers using laser cutting techniques according to the present invention.

FIG. 2 shows the flow chart of the fabrication method disclosed by the present invention for dicing a semiconductor wafer by laser cutting techniques, which comprises following steps: covering the surface of semiconductor wafer with a protection layer; dicing the semiconductor wafer by laser and separating the die units; removing the laser cutting residues on the devices on the die units via wet etching by an acidic water solution; and removing the protection layer by a non-acidic water solution; and cleaning the devices on the die units. The selection of materials for protection layer must consider the following factors: where (1) the protection layer must have good capability for covering on the semiconductor wafer; and (2) the protection layer must be corrosion-resistant to the acidic water solution for removing the laser cutting residues. The wafer is fixed by a tape during performing the fabrication method of the present invention, so the selection of materials for making the protection layer needs further to consider: (3) that the tape for fixing the semiconductor wafer must not be disrupted during the steps for covering and removing the protection layer.

Figures 3A, 3B:
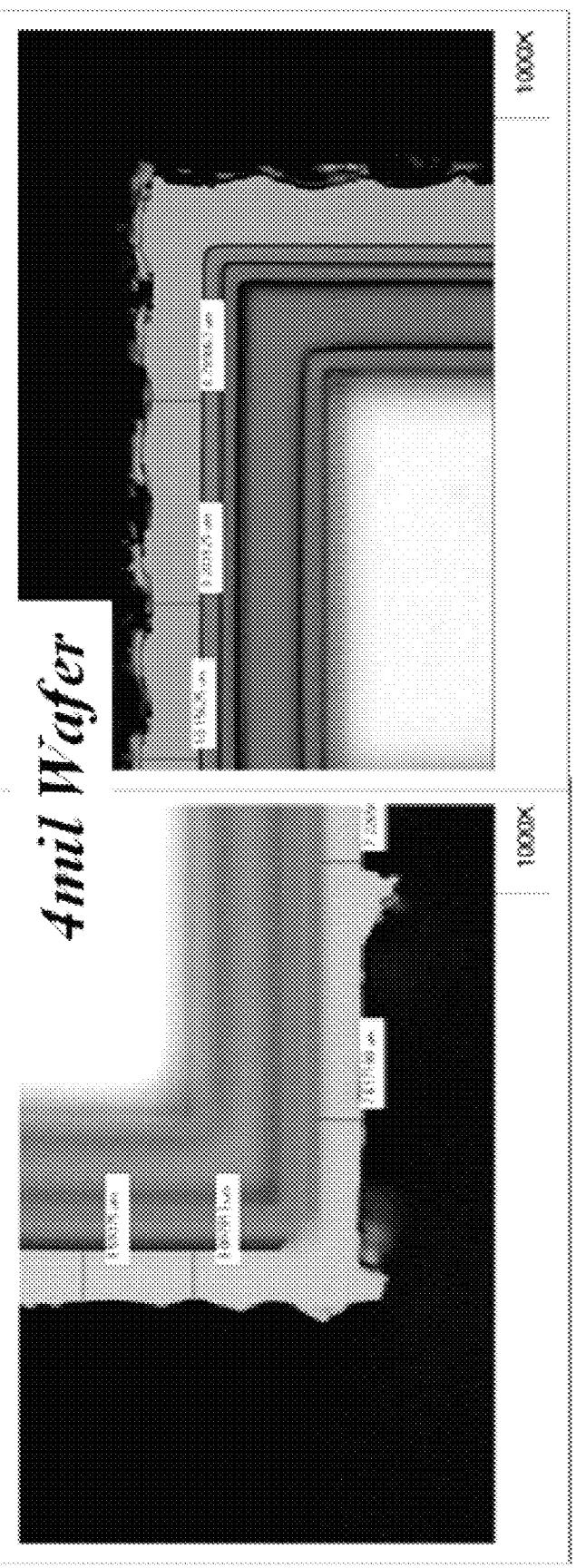
FIGS. 3A and 3B are the optical microscope views of surface around the device after the dicing of semiconductor wafers using laser cutting techniques.
Figure 4A:
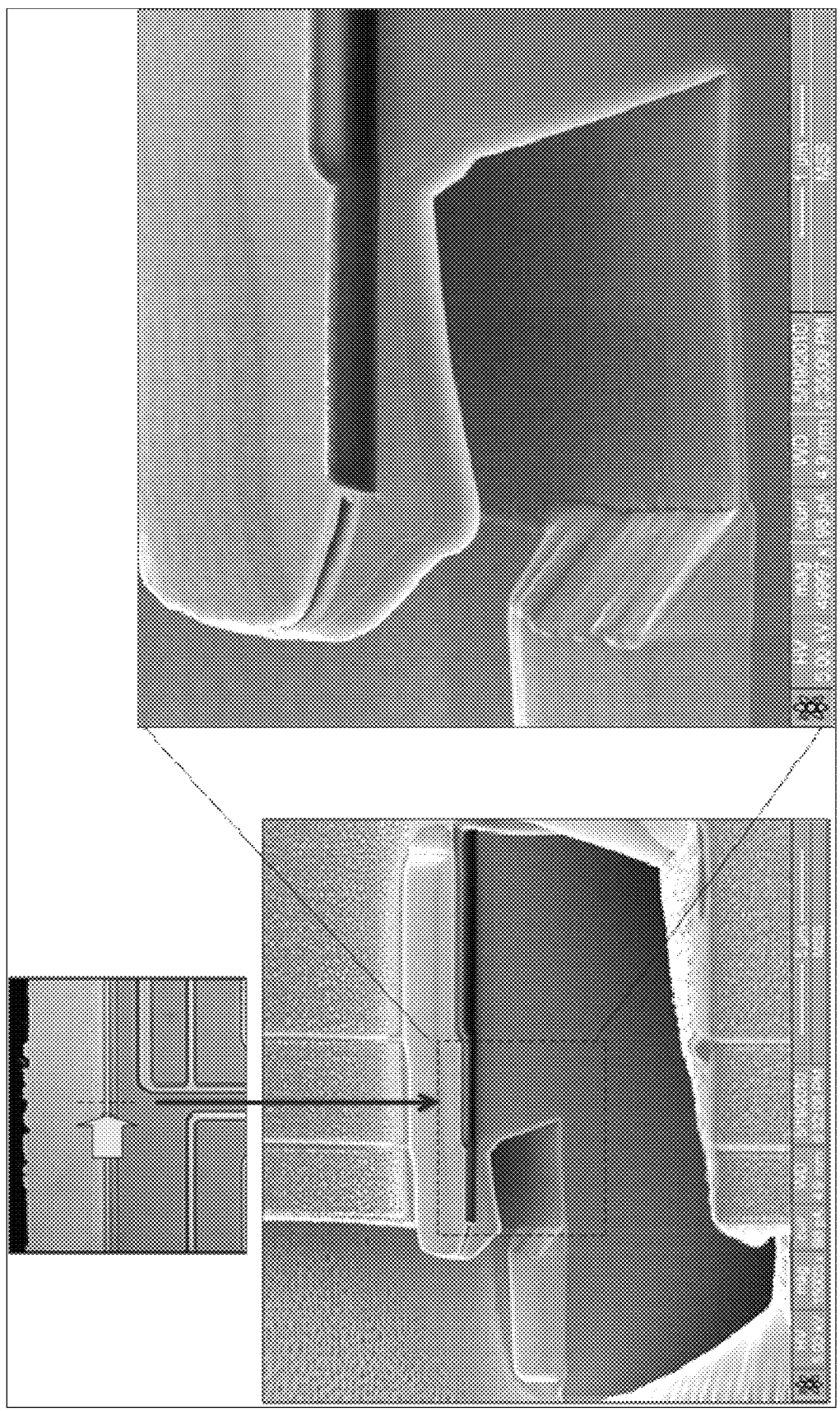
FIGS. 4A and 4B are the scanning electron microscope views of surface around the device after the dicing of semiconductor wafers by using laser cutting techniques.
Figure 4B:
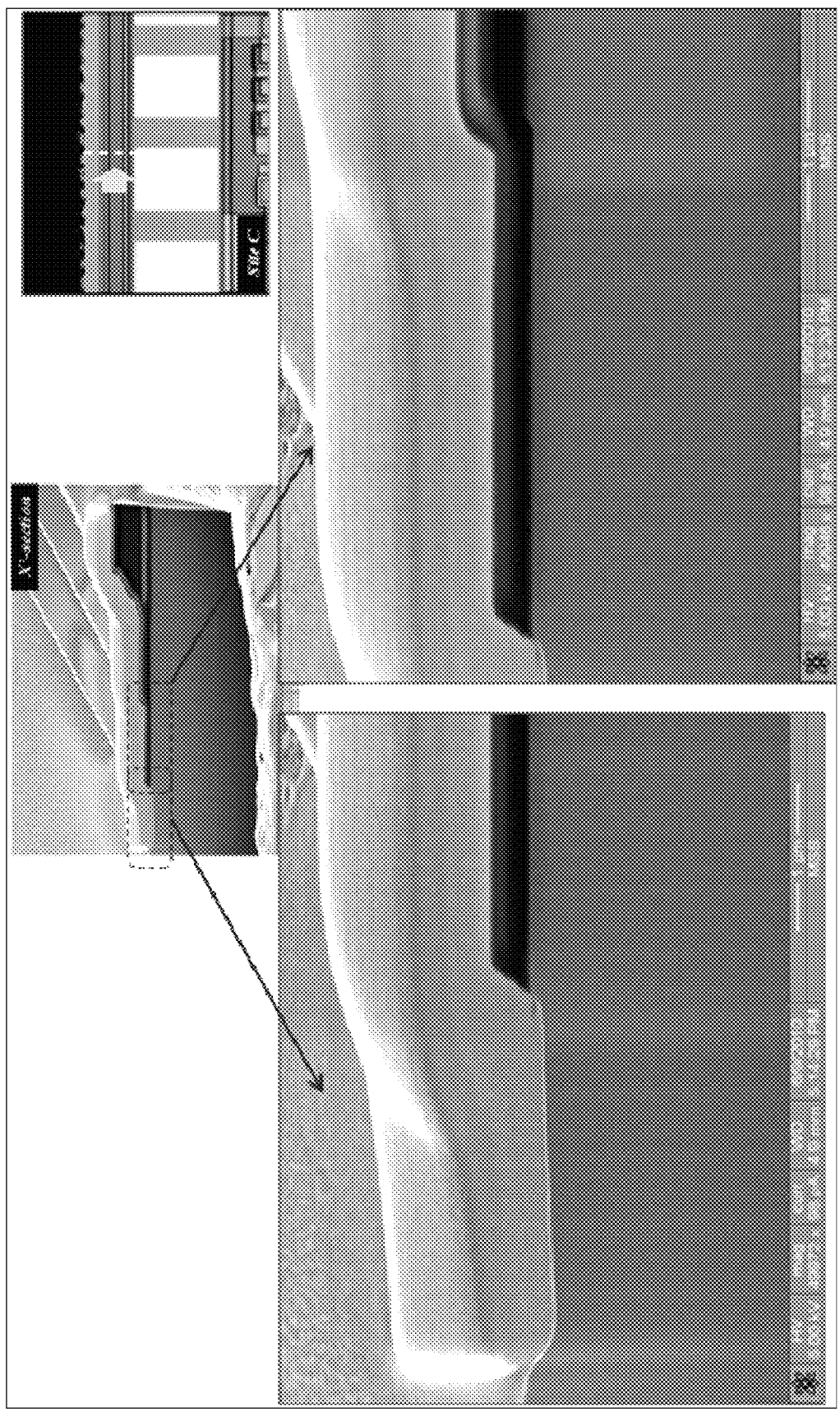

FIGS. 3A and 3B are the optical microscope views showing the surface around the device after the semiconductor having been diced by laser. FIG. 3A is the view for the conventional water-soluble PVA protection layer. FIG. 3B is the view for the photoresist protection layer of the present invention. FIGS. 4A and 4B are the scanning electron microscope views showing the cross section around the device after the semiconductor having been diced by laser. FIG. 4A is the view for the conventional water-soluble PVA protection layer. FIG. 4B is the view for the photoresist protection layer of the present invention.

The materials for making the protection layer, which match up the factors stated above, contain two types: non-metallic protection layer and metallic protection layer. The primary semiconductor wafer for the substrate treated by the fabrication method of the present invention is gallium arsenide. Some other semiconductor wafers, such as silicon(Si), indium phosphide(InP), gallium nitride(GaN), and sapphire, also can be treated by a fabrication method similar to the present invention.

To let the characteristics and function of the present invention be able to be understood further, the semiconductor wafer of gallium arsenide substrate is now taken as a preferred embodiment and some different materials for making the protection layer suitable for this substrate are in detail described as follows:

1. Photoresist

The fabrication process for the photoresist used as protection layer in the present embodiment is first described. After the devices on the semiconductor wafer have been manufactured, the wafer is fixed on the holder for the sequential steps. The photoresist is first covered on the surface of semiconductor wafer by spin coating and then dried by heat. Because the tape would degrade easily at elevated temperature, the temperature for drying would not be too high. It is confirmed by experimental test that the characteristics of tape can be kept during drying at a temperature lower than 80° C. The laser cutting step can be performed after the step for covering the photoresist protection layer. During the irradiation of focused laser light with high power, some small molten residues of gallium arsenide would be produced from the substrate due to the local high temperature. The small molten residues would recast on the cutting edge and device surface during the cutting process. Because the device surface has been covered with a photoresist protection layer, the gallium arsenide residues would adhere on the protection layer. The semiconductor wafer after being cut can be stretched out by means of the elasticity of the tape. Therefore, the separated die units adhered on the tape could be obtained. After separating the die units, the gallium arsenide residues adhered on the edge and surface of the die units due to the laser cutting could be removed via wet etching. In a conventional method, the gallium arsenide residues are removed by the water solution of ammonium hydroxide($NH_4OH$) and hydrogen peroxide ($H_2O_2$), but in the mean time, the photoresist on surface would also be removed by the etching solution. Therefore, the present invention takes an acidic water solution of sulfuric acid($H_2SO_4$) and hydrogen peroxide($H_2O_2$) as the etching solution for removing the gallium arsenide residues. This etching solution cannot etch the photoresist during the etching process. After removing the gallium arsenide residues, the photoresist is removed by the non-acidic water solution containing potassium borate and potassium hydroxide (e.g. developer AZ400K, Lai En, Taiwan). The last step is to clean the devices by using deionized water.

The experimental test for the photoresist protection layer has confirmed that the devices on the die units have no phenomenon of undercut after the step of wet etching for removing the gallium arsenide residues, so the yield of devices can be largely increased. The comparison for the undercut phenomenon around device after laser cutting is shown in FIGS. 3 and 4 for the semiconductor wafer with the conventional protection layer of pure water-soluble PVA and the photoresist protection layer of the present invention, respectively. FIG. 3 is the optical microscope view of device surface and FIG. 4 is the scanning electron microscope view of device cross-section. From the comparison between FIG. 3 and FIG. 4, it can be seen that the photoresist protection layer can effectively avoid the etching undercut phenomenon for the device.

2. Wax

The wax can also be used as the wafer surface protection layer, which has been confirmed by the experimental test. The present embodiment will describe the fabrication process for the wax used as the protection layer. After the device on the semiconductor wafer has been manufactured, it is first fixed on holder by a tape and the wax is then coated on the semiconductor wafer surface as the protection layer. After the wax protection layer has been covered on the wafer surface, the laser cutting is then performed. When the wax protection layer is irradiated by the focused layer light with high power, it easily peels off and can not effectively adhere onto the wafer surface. Therefore, before the semiconductor wafer is cut by using high power laser, a low power laser must be used to cut the wax on surface to avoid its detachment from the surface. Because the device surface has been covered with wax protection layer, the recast residues from laser cutting would adhere onto the wax protection layer. After wafer has been cut, it can be stretched out by means of elasticity of the tape and the separated die units can be adhered onto the tape. After the die units have been separated, the laser cutting residues at the die edge and on the device surface can be removed via wet etching. It is worth noting that the conventional water solution of ammonium hydroxide ($NH_4OH$) and hydrogen peroxide ($H_2O_2$) for etching gallium arsenide residues is basic and in meantime can also remove the wax protection layer on the surface. Therefore, an acidic etching solution is used as the etching solution for gallium arsenide residues in the present invention to ensure the wax protection layer without being disrupted during the etching process. The acidic etching water solution can also be a water solution of hydrochloric acid (HCl) and hydrogen peroxide ($H_2O_2$), or a water solution of sulfuric acid ($H_2SO_4$) and hydrogen peroxide ($H_2O_2$). The experimental tests confirm that the water solution of sulfuric acid and hydrogen peroxide have a more rapid etching rate and a better effect. After the gallium arsenide residues are removed, the wax protection layer can be removed from the device surface by a non-acidic water solution of ammonium hydroxide ($NH_4OH$) and hydrogen peroxide ($H_2O_2$). The last step is to clean the device by using deionized water.

3. Metal Layer

The experimental tests confirm that the metal layer also can be used as the protection layer. The present embodiment will describe the fabrication process for metal protection layer. The present embodiment is similar to the embodiments stated above. After the devices have been formed on semiconductor wafer, the wafer is first fixed on the holder by a tape, and a metal layer as a protection layer is then coated on the semiconductor wafer surface by a sputtering method. Because the gold (Au) is generally used as the metallic electrode on the device surface, it is not suitable for the metal protection layer. The metals suitable for the metal protection layer include titanium-tungsten alloy (TiW), dual layer structure of titanium-tungsten alloy and titanium-tungsten alloy nitride (TiW/TiWNx), and dual layer structure of titanium and titanium nitride (Ti/TiNx). After the wafer has been covered with a metal protection layer, it can then be cut by laser. A low power laser is first used to pre-cut the metal protection layer on the surface, which can effectively improve the evenness of cut edge. A high power laser is then used to cut the semiconductor wafer after pre-cutting. Because the device surface has been protected by a metal layer, the residues produced during the cutting process would adhere onto the metal protection layer. After the wafer has been cut, it can be stretched by the elasticity of the tape and the die units can be separated, which is the same as the above embodiments. After the die units have been separated, the laser cutting residues at die edge and on device surface can be removed via a wet etching. When the metal layer is used as the protection layer, the acidic water solution of sulfuric acid ($H_2SO_4$) and hydrogen peroxide ($H_2O_2$) can be taken as the etching solution for gallium arsenide residues. After the gallium arsenide residues have been removed, the titanium-tungsten alloy protection layer on the surface can be removed by the non-acidic water solution of hydrogen peroxide ($H_2O_2$). The last step is to clean the device by deionized water. It is worth noting that the titanium-tungsten alloy protection layer is not easy to be removed by water solution of hydrogen peroxide at room temperature. The temperature of water solution of hydrogen peroxide is generally increased for increasing the removing rate; however, to prevent the property of tape from being destroyed, the solution should be controlled at a temperature lower than 80° C. Furthermore, although the metal protection layer can effectively prevent the device from the phenomenon of undercut, the thinned wafer would still have a risk of fracture in the sputtering process.

The statement above is the preferred embodiments and techniques of the present invention. However, there are many variations and modifications derived from the disclosures and teachings of the present invention. If the effects of any equivalent fabrication method formed according to the present invention don't violate the essential spirits in the description text and drawings, they should be regarded to fall into the scope defined by the appended claims.

The invention claimed is:

1. A fabrication method for dicing of semiconductor wafers using laser cutting techniques comprising the following steps:
    covering surface of the semiconductor wafers with a protection layer;
    dicing the semiconductor wafers by means of laser cutting techniques and separating die units;
    removing laser cutting residues on the devices on die units via wet etching by using an acidic water solution;
    removing said protection layer by using a non-acidic water solution; and
    cleaning the devices on the die units;
    wherein the semiconductor wafer is made by gallium arsenide, indium phosphide, or silicon;
    wherein said protection layer is made by materials further containing properties:
        good covering capability for semiconductor wafers;
        being able to resist said acidic water solution used for removing the laser cutting residue;
        being unable to disrupt tape used for fixing semiconductor wafers in the steps for covering and removing said protection layer,
    wherein said protection layer is a wax, and
    wherein said acidic water solution used in the step for removing the laser cutting residues on the devices on the die units is a water solution of sulfuric acid ($H_2SO_4$) and hydrogen peroxide ($H_2O_2$), and wherein said non-acidic water solution used in the step for removing said protection layer is a water solution of ammonium hydroxide ($NH_4OH$) and hydrogen peroxide ($H_2O$).

2. A fabrication method for dicing of semiconductor wafers using laser cutting techniques comprising the following steps:
    covering surface of the semiconductor wafers with a protection layer;
    dicing the semiconductor wafers by means of laser cutting techniques and separating die units;
    removing laser cutting residues on the devices on die units via wet etching by using an acidic water solution;
    removing said protection layer by using a non-acidic water solution; and
    cleaning the devices on the die units;
    wherein the semiconductor wafer is made by gallium arsenide, indium phosphide, or silicon;
    wherein said protection layer is made by materials further containing properties:
        good covering capability for semiconductor wafers;
        being able to resist said acidic water solution used for removing the laser cutting residue;

being unable to disrupt tape used for fixing semiconductor wafers in the steps for covering and removing said protection layer,
wherein said protection layer is a wax, and
wherein said acidic water solution used in the step for removing the laser cutting residues on the devices on the die units is a water solution of hydrochloric acid (HCl) and hydrogen peroxide ($H_2O_2$), and wherein said non-acidic water solution used in the step for removing said protection layer is a water solution of ammonium hydroxide ($NH_4OH$) and hydrogen peroxide ($H_2O_2$).

* * * * *